US012563688B2

(12) United States Patent
Takahashi et al.

(10) Patent No.: US 12,563,688 B2
(45) Date of Patent: Feb. 24, 2026

(54) CAPACITOR BOARD UNIT AND POWER CONVERSION DEVICE

(71) Applicant: Mitsubishi Electric Corporation, Tokyo (JP)

(72) Inventors: Hiroaki Takahashi, Tokyo (JP); Yu Kishiwada, Tokyo (JP); Toshio Watanabe, Tokyo (JP); Yasuhiko Kitamura, Tokyo (JP); Shogo Matsuoka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 353 days.

(21) Appl. No.: 18/282,914

(22) PCT Filed: Apr. 27, 2021

(86) PCT No.: PCT/JP2021/016724

§ 371 (c)(1),
(2) Date: Sep. 19, 2023

(87) PCT Pub. No.: WO2022/230037

PCT Pub. Date: Nov. 3, 2022

(65) Prior Publication Data

US 2024/0188246 A1     Jun. 6, 2024

(51) Int. Cl.
*H05K 7/14*          (2006.01)
*H02M 3/00*          (2006.01)
*H05K 1/02*          (2006.01)

(52) U.S. Cl.
CPC .......... *H05K 7/1432* (2013.01); *H02M 3/003* (2021.05); *H05K 1/0203* (2013.01); *H05K 2201/10015* (2013.01)

(58) Field of Classification Search
CPC .. H05K 7/1432; H05K 7/1427; H05K 7/1422; H05K 7/14417; H05K 7/14;
(Continued)

(56) References Cited

U.S. PATENT DOCUMENTS

2010/0133681 A1*  6/2010  Oka ...................... H01L 23/041
                                                 257/693
2014/0321065 A1*  10/2014 Nishimura ........... H05K 1/0203
                                                 361/722
(Continued)

FOREIGN PATENT DOCUMENTS

JP        2001-352767 A     12/2001
JP        2010-182898 A      8/2010
JP         2019-4582 A       1/2019

OTHER PUBLICATIONS

International Search Report for PCT/JP2021/016724 dated Jul. 6, 2021.
Written Opinion for PCT/JP2021/016724 dated Jul. 6, 2021.

*Primary Examiner* — Nguyen Tran
(74) *Attorney, Agent, or Firm* — Sughrue Mion, PLLC

(57)          ABSTRACT

The sum of the DC resistance value from the positive power supply terminal to each positive load terminal and the DC resistance value from the negative power supply terminal to each negative load terminal is smaller than the sum of the DC resistance value between the positive power supply terminal and the positive load terminal and the DC resistance value between the negative power supply terminal and the negative load terminal. In addition, the inductance value between the positive load terminal and the negative load terminal through the positive smoothing terminals, the wirings, the capacitors, and the negative smoothing terminals is smaller than the sum of the inductance values from the positive power supply terminal to the positive load terminal and from the negative power supply terminal to the negative load terminal.

12 Claims, 9 Drawing Sheets

(58) Field of Classification Search
 CPC .. H05K 1/0203; H05K 1/0206; H05K 1/0209;
    H05K 1/0213; H05K 1/11; H05K 1/119;
    H05K 1/142; H05K 1/145; H05K 1/18;
    H05K 2201/10015; H02M 3/003; H02M
    3/00; H02M 3/0015; H02M 3/04; H02M
                3/07
 See application file for complete search history.

(56) References Cited

U.S. PATENT DOCUMENTS

2018/0367055 A1    12/2018  Kitamura et al.
2024/0171085 A1*    5/2024  Ikehara ................... H02M 1/14

* cited by examiner

CAPACITOR BOARD UNIT AND POWER CONVERSION DEVICE

CROSS REFERENCE TO RELATED APPLICATIONS

This application is a National Stage of International Application No. PCT/JP2021/016724 filed Apr. 27, 2021.

TECHNICAL FIELD

The present disclosure relates to a capacitor board unit and a power conversion device.

BACKGROUND ART

Power conversion devices such as AC/DC converters, DC-DC converters, and inverters are used in the field of power electronics. A power conversion device includes a power conversion unit which converts power through switching operation of a switching element which is a semiconductor element. In addition, the power conversion device includes a capacitor for smoothing voltage in which an AC component is superposed on a DC component. An example of a configuration of a capacitor of the power conversion device is a board unit on which a plurality of capacitor elements are disposed on a board. When current outputted from a switching element increases in response to a request for high output of the power conversion device, a technology that increases allowable current of a capacitor board unit is required.

As a capacitor board unit to which large current is inputted from outside, a configuration in which a capacitor is directly connected to a metal conductive board has been disclosed (see Patent Document 1, for example).

CITATION LIST

Patent Document

Patent Document 1: Japanese Laid-Open Patent Publication No. 2001-352767

SUMMARY OF THE INVENTION

Problems to be Solved by the Invention

In the capacitor board unit in Patent Document 1 above, AC current caused by pulsation of input voltage is superposed on DC current, and thus, a DC current component and an AC current component flow at the same time in the metal conductive board. In the disclosed capacitor board unit, if current is increased, heat generated in the conductive board and heat generated in other components connected to the conductive board increase. Since a metal conductive board is excellent in heat conductivity, heat due to the heat generation therein is directly transferred to the capacitor, and thus, the temperature of the capacitor increases. There is a problem that increase in the temperature of the capacitor can lead to deterioration, failure, and the like of the capacitor. Further, when DC current on which AC current is superposed flows in a circuit board having the capacitor mounted thereon, heat generated in the circuit board increases. In order to suppress heat generation in the circuit board, the thickness of the conductive wiring pattern of the circuit board may be increased, or a structure for heat dissipation or cooling may be provided for the circuit board and the capacitor, for example. However, in such a case, the capacitor board unit becomes complicated and the cost increases.

Meanwhile, an external device that uses, as power supply, DC voltage from a DC power supply may be connected on the DC power supply side of the power conversion device including the capacitor board unit. In such a case, with respect to the external device, voltage pulsation caused by an AC component superposed on DC voltage through operation of the power conversion device needs to be suppressed to be less than a predetermined value. It is ideal that the AC current component that causes voltage pulsation is smoothed in the capacitor board unit, without flowing to the external device. In the disclosed capacitor board unit, a DC current component and an AC current component flow in the metal conductive board, while being superposed with each other. Thus, unless the impedance of the conductive board is suppressed to be small, the AC current component flowing to the outside increases. There is a problem that, when the AC current component flowing to the outside increases, voltage pulsation of DC voltage increases. In an external device that uses DC voltage as power supply, voltage pulsation may cause a failure and erroneous operation.

Therefore, the present disclosure is directed to: obtaining a capacitor board unit in which an AC current component flowing to the outside is suppressed, while suppressing increase in temperature of a capacitor; and obtaining a power conversion device in which an AC current component flowing to the outside is suppressed.

Means to Solve the Problem

A capacitor board unit according to the present disclosure includes: a wiring board having wiring; a positive bus bar having at least one positive power supply terminal connected to a positive electrode of a power supply, a plurality of positive load terminals respectively connected to positive electrodes of a plurality of loads, and a plurality of positive smoothing terminals connected to the wiring; a negative bus bar having at least one negative power supply terminal connected to a negative electrode of the power supply, a plurality of negative load terminals respectively connected to negative electrodes of the plurality of loads, and a plurality of negative smoothing terminals connected to the wiring; and a plurality of capacitors each having a positive capacitor terminal and a negative capacitor terminal, the positive capacitor terminal and the negative capacitor terminal being connected to the wiring. The wiring has positive wiring which connects, in series and in parallel, the plurality of positive smoothing terminals and the plurality of positive capacitor terminals, and negative wiring which connects, in series and in parallel, the plurality of negative smoothing terminals and the plurality of negative capacitor terminals. A bus bar side DC resistance value which is a sum of a DC resistance value of the positive bus bar from the positive power supply terminal to each positive load terminal and a DC resistance value of the negative bus bar from the negative power supply terminal to each negative load terminal is smaller than a wiring board side DC resistance value which is a sum of a positive wiring board side DC resistance value which is a DC resistance value between the positive power supply terminal and the positive load terminal through a plurality of the positive smoothing terminals and the positive wiring, and a negative wiring board side DC resistance value which is a DC resistance value between the negative power supply terminal and the negative load terminal through a plurality of the negative smoothing terminals and the negative wiring. In addition, a capacitor side inductance value which is an inductance value between the positive load terminal and the negative load terminal through a plurality of the positive smoothing terminals, the positive wiring, a plurality of the capacitors, the negative wiring, and a plurality of the negative smoothing terminals is smaller than a bus bar side inductance value which is a sum of an inductance value of the positive bus bar from the positive power supply terminal to the positive load terminal and an inductance value of the negative bus bar from the negative power supply terminal to the negative load terminal.

A power conversion device according to the present disclosure includes: the capacitor board unit according to the present disclosure; and a power conversion unit connected between each of the plurality of positive load terminals and each of the plurality of negative load terminals.

Effect of the Invention

According to the capacitor board unit of the present disclosure, a bus bar side DC resistance value which is a sum of a DC resistance value of the positive bus bar from the positive power supply terminal to each positive load terminal and a DC resistance value of the negative bus bar from the negative power supply terminal to each negative load terminal is smaller than a wiring board side DC resistance value which is a sum of a positive wiring board side DC resistance value which is a DC resistance value between the positive power supply terminal and the positive load terminal through a plurality of the positive smoothing terminals and the positive wiring, and a negative wiring board side DC resistance value which is a DC resistance value between the negative power supply terminal and the negative load terminal through a plurality of the negative smoothing terminals and the negative wiring. In addition, a capacitor side inductance value which is an inductance value between the positive load terminal and the negative load terminal through a plurality of the positive smoothing terminals, the positive wiring, a plurality of the capacitors, the negative wiring, and a plurality of the negative smoothing terminals is smaller than a bus bar side inductance value which is a sum of an inductance value of the positive bus bar from the positive power supply terminal to the positive load terminal and an inductance value of the negative bus bar from the negative power supply terminal to the negative load terminal. Accordingly, DC current hardly flows through the positive wiring, the capacitor, and the negative wiring, and thus, temperature increase in the capacitor can be suppressed. Since AC current due to pulsation of output voltage from the load connected to the positive load terminal and the negative load terminal flows through a path passing from the positive smoothing terminal through the positive wiring, the capacitor, and the negative wiring to the negative smoothing terminal, the AC current component flowing from the capacitor board unit to the outside can be suppressed.

The power conversion device of the present disclosure includes: the capacitor board unit according to the present disclosure; and a power conversion unit connected between each of the plurality of positive load terminals and each of the plurality of negative load terminals. Thus, since AC current due to pulsation of output voltage from the power conversion unit flows through a path passing from the positive smoothing terminal through the positive wiring, the capacitor, and the negative wiring to the negative smoothing terminal, the AC current component flowing from the power conversion device to the outside can be suppressed.

DESCRIPTION OF EMBODIMENTS

Figure 1:
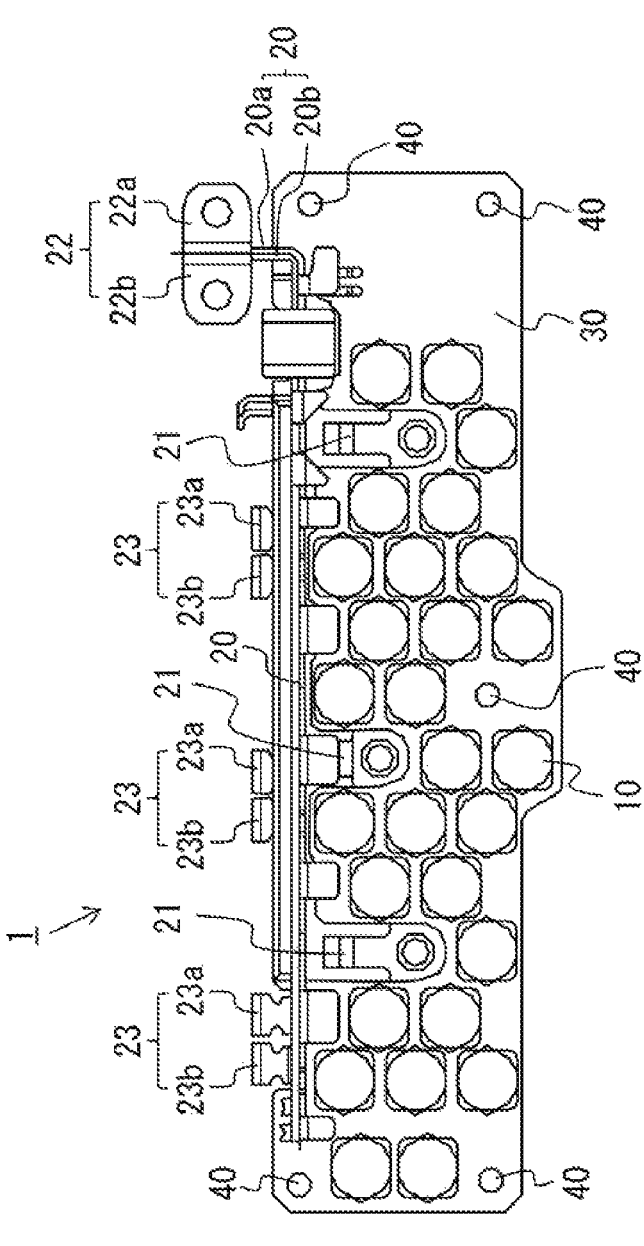
FIG. 1 is a plan view showing a capacitor board unit according to embodiment 1.

Hereinafter, a capacitor board unit and a power conversion device according to an embodiment of the present disclosure will be described with reference to the drawings. In the drawings, the same or corresponding members and parts are denoted by the same reference characters, to give description.

Embodiment 1

Figure 2:
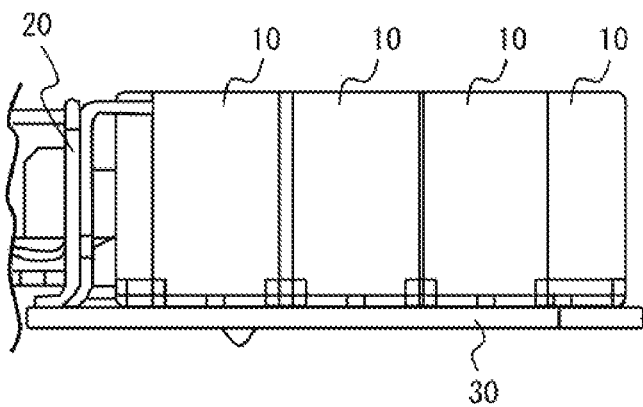
FIG. 2 is a side view showing the capacitor board unit according to embodiment 1.
Figure 3:
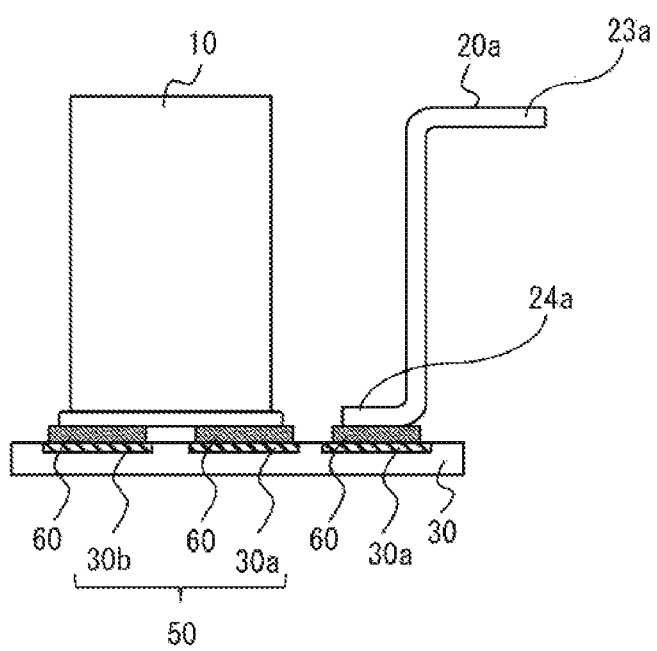
FIG. 3 shows a major part of the capacitor board unit according to embodiment 1.
Figure 4:
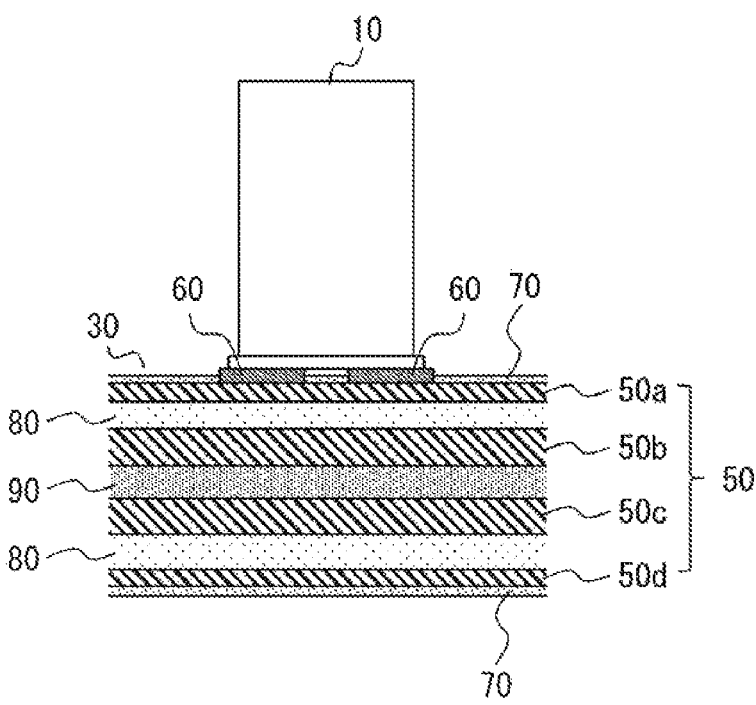
FIG. 4 is a sectional view of a wiring board of the capacitor board unit according to embodiment 1.
Figure 5:
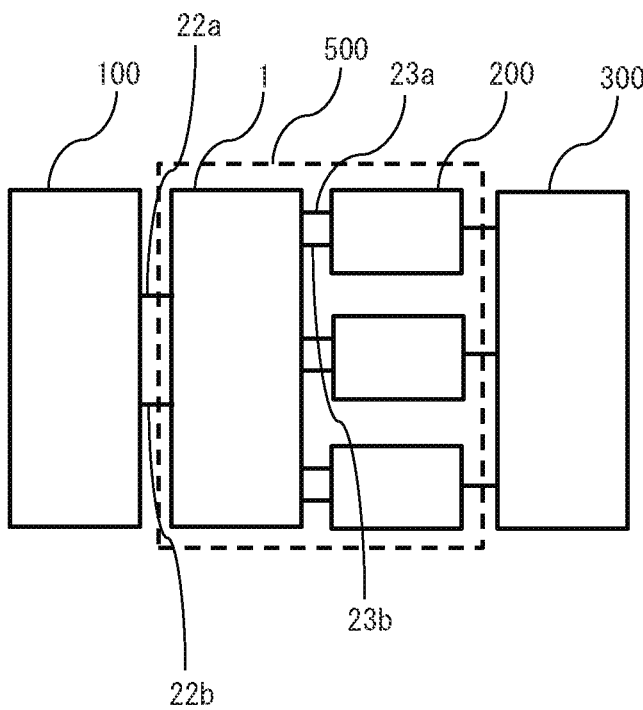
FIG. 5 is a schematic diagram showing an outline of a power conversion device according to embodiment 1.
Figure 6:
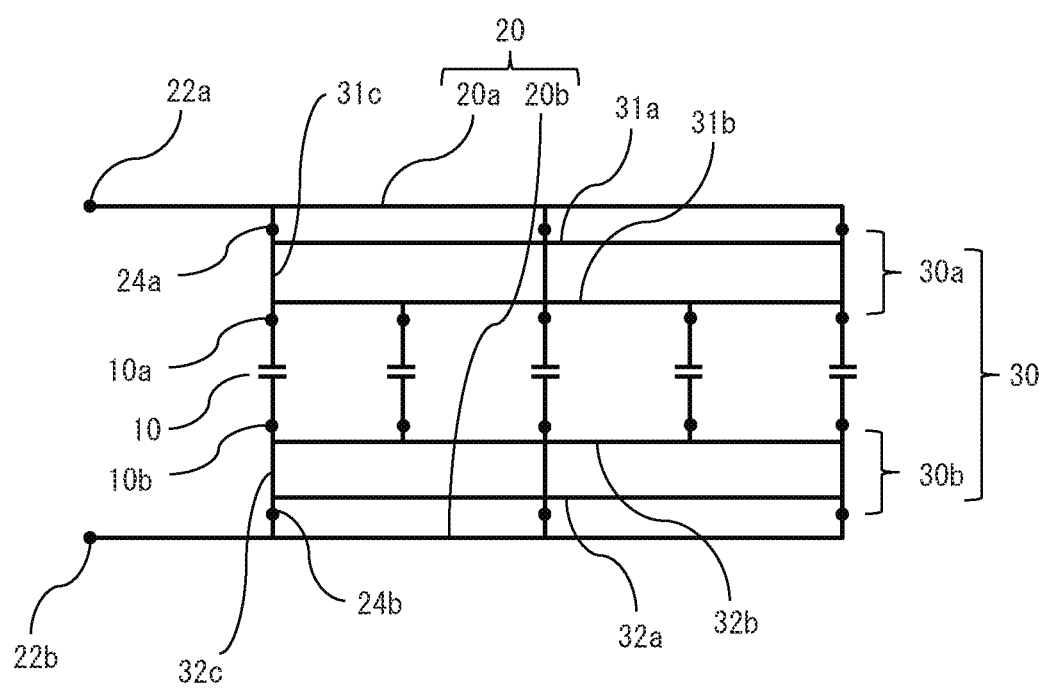
FIG. 6 is a schematic circuit diagram of the capacitor board unit according to embodiment 1.
Figure 7:
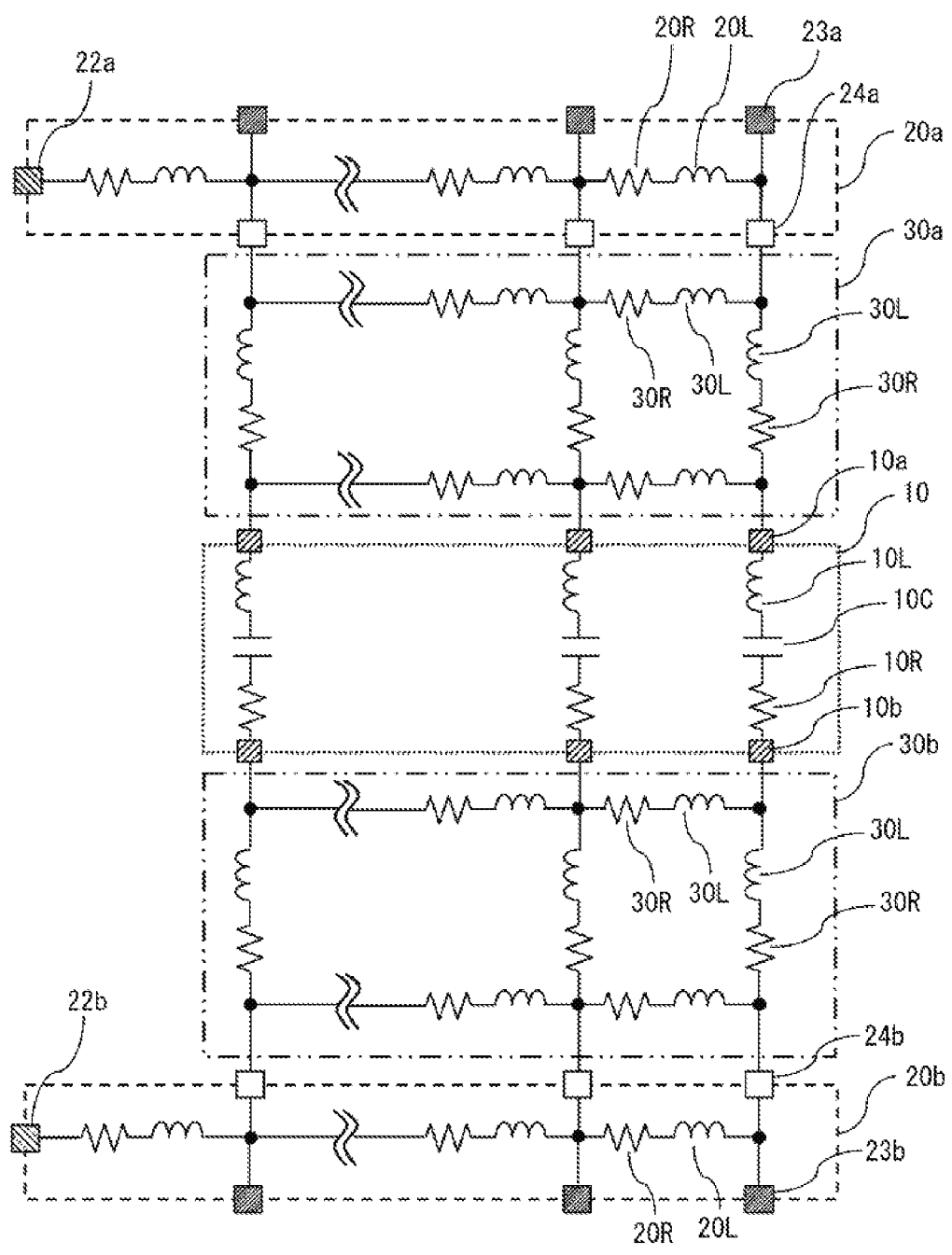
FIG. 7 is an equivalent circuit diagram of the capacitor board unit according to embodiment 1.
Figure 8:
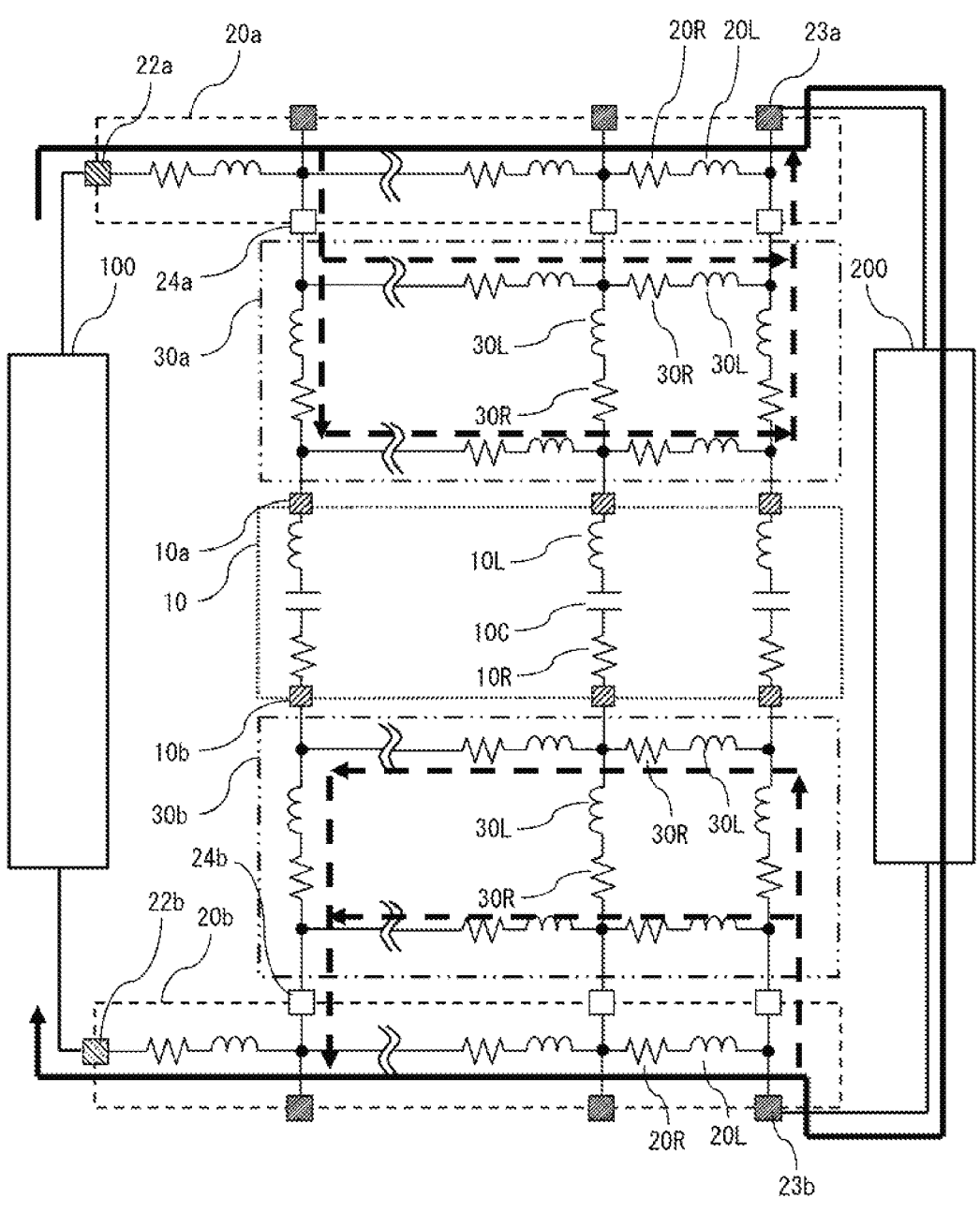
FIG. 8 shows a path of DC current in the equivalent circuit diagram of the capacitor board unit according to embodiment 1.
Figure 9:
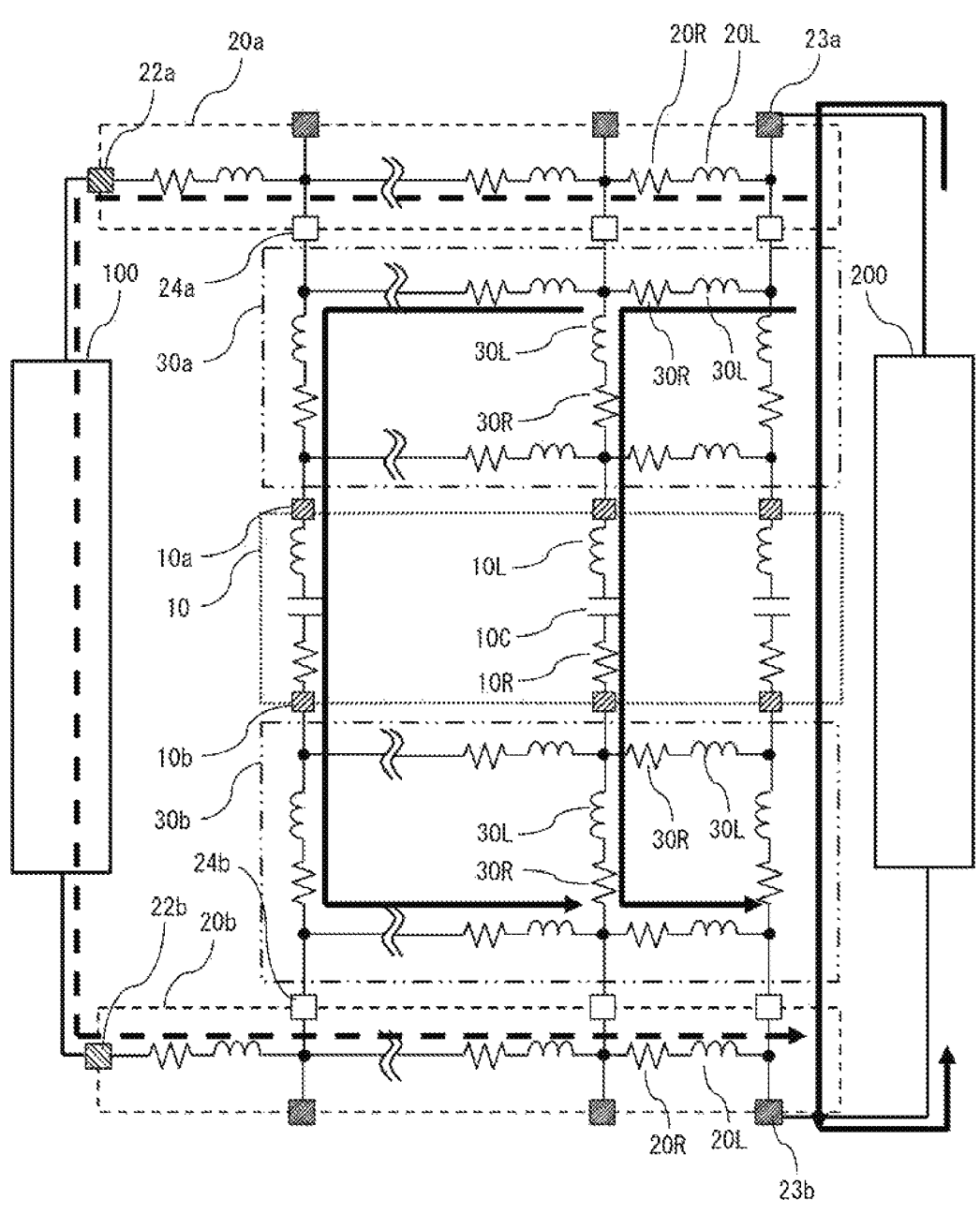
FIG. 9 shows a path of AC current in the equivalent circuit diagram of the capacitor board unit according to embodiment 1.

FIG. 1 is a plan view showing a capacitor board unit 1 according to embodiment 1. FIG. 2 is a side view showing the capacitor board unit 1. FIG. 3 shows a major part of the capacitor board unit 1, and is a schematic diagram showing connection between a wiring board 30, a capacitor 10 and a bus bar 20. FIG. 4 is a sectional view of the wiring board 30 of the capacitor board unit 1. FIG. 5 is a schematic diagram showing an outline of a power conversion device 500 according to embodiment 1. FIG. 6 is a schematic circuit diagram of the capacitor board unit. FIG. 7 is an equivalent circuit diagram of the capacitor board unit 1. FIG. 8 shows a path of DC current in the equivalent circuit diagram of the capacitor board unit 1. FIG. 9 shows a path of AC current in the equivalent circuit diagram of the capacitor board unit 1. The capacitor board unit 1 is mounted to the power conversion device 500 which converts a desired level of power into DC or AC voltage. The capacitor board unit 1 includes a plurality of the capacitors 10, and smooths voltage in which an AC component is superposed on a DC component.

<Power Conversion Device 500>

As shown in FIG. 5, the power conversion device 500 includes the capacitor board unit 1 and power conversion units 200 which are loads. The capacitor board unit 1 has load terminals 23 connected to the capacitor board unit 1. The load terminals 23 have a plurality of positive load terminals 23*a* connected to the positive electrodes of the power conversion units 200, and a plurality of negative load terminals 23*b* connected to the negative electrodes of the power conversion units 200. The power conversion unit 200 is connected between each of the plurality of positive load terminals 23a and each of the plurality of negative load terminals 23b. The power conversion unit 200 has, for example, a function of converting DC power into AC power. The capacitor board unit 1 has a power supply terminal 22 connected to an external power supply 100. The power supply terminal 22 has a positive power supply terminal 22a connected to the positive electrode of the external power supply 100, and a negative power supply terminal 22b connected to the negative electrode of the external power supply 100. The power conversion device 500 converts power of the external power supply 100 into DC or AC voltage, and outputs the resultant power to an external device 300. In the present embodiment, the capacitor board unit 1 has one positive power supply terminal 22a and one negative power supply terminal 22b. However, not limited thereto, the capacitor board unit 1 may include a plurality of positive power supply terminals 22a and negative power supply terminals 22b. Further, the number of power conversion units 200 connected to the capacitor board unit 1 is not limited to three, either.

<Capacitor Board Unit 1>

As shown in FIG. 1, the capacitor board unit 1 includes the capacitors 10, the bus bar 20, and the wiring board 30 having wiring. In the capacitor board unit 1 of the present embodiment, each capacitor 10 and the bus bar 20 are mounted on the wiring board 30, and as shown in FIG. 6, the capacitor 10 and the bus bar 20 are electrically connected through the wiring formed at the wiring board 30.

The capacitor 10 is an electric component mainly having a function of storing power, i.e., so-called charging, and a function of discharging stored power. In general, an aluminum electrolytic capacitor, a film capacitor, a ceramic capacitor, or the like is used as the capacitor 10 of the capacitor board unit 1. In the present embodiment, a case where an aluminum electrolytic capacitor is used as the capacitor 10 will be described. The aluminum electrolytic capacitor is a capacitor that has the largest capacitance per unit volume. Therefore, use of a plurality of aluminum electrolytic capacitors connected in parallel can realize the capacitor board unit 1 having a small size and a large capacitance. FIG. 1 shows a layout example in which 28 capacitors 10 are connected in parallel. However, the number of the capacitors 10 is not limited thereto.

Each capacitor 10 has a positive capacitor terminal 10a and a negative capacitor terminal 10b. As shown in FIG. 2, each capacitor 10 is mounted on the front surface of the wiring board 30. The positive capacitor terminal 10a and the negative capacitor terminal 10b (not shown in FIG. 2) are connected to the wiring of the wiring board 30. The plurality of capacitors 10 are connected in parallel between a plurality of positive smoothing terminals 24a and a plurality of negative smoothing terminals 24b. With this configuration, the capacitor board unit 1 having a small size and a large capacitance can be realized. In the present embodiment, 28 capacitors 10 are connected in parallel to three positive smoothing terminals 24a and three negative smoothing terminals 24b. However, the numbers thereof are not limited thereto.

The bus bar 20 forms a current path through which DC current mainly flows. As shown in FIG. 1, the bus bar 20 includes a positive bus bar 20a and a negative bus bar 20b. The positive bus bar 20a has: at least one positive power supply terminal 22a connected to the positive electrode of the external power supply 100; the plurality of positive load terminals 23a respectively connected to the positive electrodes of the plurality of power conversion units 200; and the plurality of positive smoothing terminals 24a (not shown in FIG. 1) connected to the wiring. The negative bus bar 20b has: at least one negative power supply terminal 22b connected to the negative electrode of the external power supply 100; the plurality of negative load terminals 23b respectively connected to the negative electrodes of the plurality of power conversion units 200; and the plurality of negative smoothing terminals 24b (not shown in FIG. 1) connected to the wiring. The positive power supply terminal 22a and the negative power supply terminal 22b form the power supply terminal 22. The positive load terminals 23a and the negative load terminals 23b form the load terminals 23. The bus bar 20 and the wiring board 30 are electrically and mechanically connected by the positive smoothing terminals 24a and the negative smoothing terminals 24b. The bus bar 20 and the wiring board 30 can be electrically and mechanically connected due to reflow. Thus, work steps and cost are reduced, and the structure is also simplified. Therefore, productivity of the capacitor board unit 1 can be improved.

For the bus bar 20, a copper material which has small electrical resistivity and which is excellent in conductivity is used. The material of the bus bar 20 is not limited to copper, and there is no problem even if another metal material is used. The copper material is a material on which mechanical work such as breaking, cutting, bending, perforation, etc. can be easily performed, and thus, allows easy production of a complicated shape. Further, for the copper material, press work using a die can be employed. Press work enables working on a copper material in a shorter period as compared to mechanical work, and thus, can reduce manufacturing cost of the bus bar 20. The capacitor board unit 1 shown in FIG. 1 includes three load terminals 23, but the number thereof may be one or may be four or greater.

An insulation member (not shown) is provided between the positive bus bar 20a and the negative bus bar 20b. The insulation member prevents short circuit between the positive bus bar 20a and the negative bus bar 20b. The insulation member is insulation paper, for example. The positive bus bar 20a, the negative bus bar 20b, and the insulation member are integrally molded with a resin portion 21. Examples of a method for integrating the resin portion 21 and the bus bar 20 include an insert molding method and an outsert molding method. The resin portion 21 has screw fastening holes for fastening the bus bar 20 to the wiring board 30. These holes and screws are used to fasten the bus bar 20 and the wiring board 30, whereby the bus bar 20 and the wiring board 30 are mechanically connected. Here, the resin portion 21 is fixed to the wiring board 30 at three positions. Since the resin portion 21 is fixed to the wiring board 30 in this manner, vibration resistance of the bus bar 20 can be improved. Further, reliability of electric connection between the bus bar 20 and the wiring board 30 can be improved.

The wiring board 30 is a general printed wiring board made of a glass composite board such as CEM-3 or a glass epoxy board such as FR-4, for example. In the wiring board 30, a wiring layer 50 having wiring is provided in a layered manner, and the wiring board 30 has a multilayer structure in which at least two wiring layers 50 including a wiring layer at the front surface and a wiring layer at the back surface are layered. The wiring board 30 includes screw fastening holes 40 for fastening to a housing or the like by screws. The wiring of the wiring board 30 has positive wiring 30a which connects the positive smoothing terminals 24a and the positive capacitor terminals 10a, and negative wiring 30b which connects the negative smoothing terminals 24b and the negative capacitor terminals 10b. As shown in FIG. 6, the positive wiring layer forming the positive wiring 30a is configured to be able to connect the positive smoothing terminals 24a and the positive capacitor terminals 10a in parallel, and the negative wiring layer forming the negative wiring 30b is configured to be able to connect the negative smoothing terminals 24b and the negative capacitor terminals 10b in parallel. In FIG. 6, the load terminals 23 are omitted. FIG. 6 shows an example in which five capacitors 10 are connected in parallel, but the number of the capacitors 10 is not limited thereto.

The wiring board 30 includes: a first positive side wire 31a to which n (n is an integer of 2 or greater) positive smoothing terminals 24a are dispersedly connected; a second positive side wire 31b to which the positive capacitor terminals 10a of the plurality of capacitors 10 are dispersedly connected; n positive side connection wires 31c respectively connecting n portions connected to the n positive smoothing terminals 24a in the first positive side wire 31a and $n$ dispersed portions in the second positive side wire 31b; a first negative side wire 32a to which n negative smoothing terminals 24b are dispersedly connected; a second negative side wire 32b to which the negative capacitor terminals 10b of the plurality of capacitors 10 are dispersedly connected; and n negative side connection wires 32c respectively connecting n portions connected to the n negative smoothing terminals 24b in the first negative side wire 32a and $n$ dispersed portions in the second negative side wire 32b. Since the wires connecting the capacitors 10 in parallel is provided in this manner, low inductance of the wiring board 30 can be realized.

The first positive side wire 31a and the second positive side wire 31b are linearly formed and are disposed in parallel with each other. The first negative side wire 32a and the second negative side wire 32b are linearly formed and are disposed in parallel with each other. Since the wires are formed in a matrix manner in this manner, low inductance of the wiring board 30 can be further realized.

Although the structure of the wiring board 30 is not limited to a layered structure, when a layered structure is employed, positive and negative patterns of the wiring layers are provided to be close to each other, and thus, low inductance of the wiring board 30 can be easily realized. When a glass composite board or a glass epoxy board is used, production steps can be reduced due to reflow, and since the capacitor board unit 1 adapted to large current can be manufactured by an easily-available general material, productivity of the capacitor board unit 1 can be improved.

As shown in FIG. 3, the capacitor 10 and the bus bar 20 are electrically connected to the positive wiring 30a or the negative wiring 30b provided at the wiring layer 50 on the front surface of the wiring board 30, by solder 60. In FIG. 3, the positive bus bar 20a is shown, but the same applies to the negative bus bar 20b. As a method for electrically connecting by the solder 60, a reflow method can be used. With the reflow method, electrodes and the like of components to be mounted on the wiring board 30 can be electrically connected to the wiring layer 50 at the front surface of the wiring board 30, without causing the components to penetrate to the back surface of the wiring board 30. However, it is necessary to select members and components adapted to the reflow method. Besides the reflow method, another method for mounting members, components, and the like on the wiring board 30 is a flow method. In the case of the flow method, for the wiring board 30, members and components to be mounted on the wiring board 30, and the like, it is necessary to select members and components adapted to the flow method. As a method for mounting members, components, and the like on the wiring board 30, it is possible to select either the reflow method or the flow method, or both of them, as necessary.

As shown in FIG. 4, the wiring board 30 of the present embodiment is a glass epoxy board having a multilayer structure including four wiring layers 50, for example. In the wiring board 30, from the upper side, a pad (not shown), a solder resist 70, a wiring layer 50a at the front surface, a pre-preg 80, a wiring layer 50b in the second layer, a core material 90, a wiring layer 50c in the third layer, a pre-preg 80, a wiring layer 50d at the back surface, and a solder resist 70 are layered in this order. In general, the wiring layer 50a at the front surface, the wiring layer 50b in the second layer, the wiring layer 50c in the third layer, and the wiring layer 50d at the back surface are each made from a copper foil having a thickness of 35 μm or 70 μm. However, the present disclosure is not limited thereto. In consideration of heat generation (temperature increase) assumed from the value of current flowing in each wiring layer, the thickness of the wiring layer 50, as well as the width of the wiring pattern, can be arbitrarily set.

<Equivalent Circuit of Capacitor Board Unit 1>

An equivalent circuit of the capacitor board unit 1 will be described with reference to FIG. 7. In FIG. 7, not all of the 28 capacitors are shown and some of them are omitted, and thus only three capacitors are shown. The positive bus bar 20a which is a portion surrounded by a broken line has the positive power supply terminal 22a, the positive load terminals 23a, and the positive smoothing terminals 24a. Similarly, the negative bus bar 20b which is a portion surrounded by a broken line has the negative power supply terminal 22b, the negative load terminals 23b, and the negative smoothing terminals 24b. Each capacitor 10 which is a portion surrounded by a dotted line has the positive capacitor terminal 10a, and the negative capacitor terminal 10b. The positive wiring 30a which is a portion surrounded by a two-dot dashed line connects the plurality of positive smoothing terminals 24a and the plurality of positive capacitor terminals 10a in series and in parallel. Similarly, the negative wiring 30b which is a portion surrounded by a two-dot dashed line connects the plurality of negative smoothing terminals 24b and the plurality of negative capacitor terminals 10b in series and in parallel.

The positive bus bar 20a, the negative bus bar 20b, the positive wiring 30a, the negative wiring 30b, and the capacitor 10 all have DC resistance components and inductance components. As shown in FIG. 7, the positive bus bar 20a and the negative bus bar 20b both have DC resistance components 20R and inductance components 20L. The positive wiring 30a and the negative wiring 30b both have DC resistance components 30R and inductance components 30L. The capacitor 10 has a DC resistance component 10R and an inductance component 10L. The capacitance component of the capacitor 10 is assumed to be 10C. In FIG. 7, the DC resistance components 10R, 20R, 30R and the inductance components 10L, 20L, 30L shown at a plurality of locations actually have values different depending on their locations.

Each DC resistance component 20R in the positive bus bar 20a and the negative bus bar 20b is represented by electrical resistivity ρ (Ω·m) of conductor×length l (m) of conductor/cross-sectional area A (m$^2$) of conductor. Here, the conductor is a material forming the positive bus bar 20a and the negative bus bar 20b, and, for example, if the conductor is copper, the electrical resistivity thereof is about $1.68 \times 10^{-8}$ (Ω·m). Each inductance component 20L in the positive bus bar 20a and the negative bus bar 20b is determined depending on the materials and the shapes of the positive bus bar 20a and the negative bus bar 20b, the magnitudes of currents flowing therethrough, and the directions of the currents, and is separated into a self-inductance component and a mutual inductance component.

Each DC resistance component 30R in the positive wiring 30a and the negative wiring 30b is determined depending on the electrical resistivity of the material of the wire formed in the wiring board 30, the length of the wire, the cross-sectional area of the wire, and the wiring pattern. Each inductance component 30L in the positive wiring 30a and the negative wiring 30b is determined depending on the material of the wire formed in the wiring board 30, the length of the wire, the cross-sectional area of the wire, and the wiring pattern, and in addition, the magnitude of current flowing through the wire, and the direction of the current.

The DC resistance component 10R and the inductance component 10L of the capacitor 10 are respectively called equivalent series resistance (ESR) and equivalent series inductance (ESL), which are components well known in an equivalent circuit of a single capacitor.

<Path of DC Current in Equivalent Circuit of Capacitor Board Unit 1>

A path of DC current in the equivalent circuit of the capacitor board unit 1 shown in FIG. 7 will be described with reference to FIG. 8. The external power supply 100 which is a DC power supply is connected between the positive power supply terminal 22a and the negative power supply terminal 22b in FIG. 7, and the power conversion unit 200 is connected between a pair of the positive load terminal 23a and the negative load terminal 23b. In FIG. 8, the power conversion unit 200 is connected to the load terminal 23 that is farthest from the power supply terminal 22. In FIG. 8, the thick arrow indicates the path through which the DC current mainly flows.

A bus bar side DC resistance value which is the sum of the DC resistance value of the positive bus bar 20a from the positive power supply terminal 22a to the positive load terminal 23a, and the DC resistance value of the negative bus bar 20b from the negative power supply terminal 22b to the negative load terminal 23b is smaller than a wiring board side DC resistance value which is the sum of a positive wiring board side DC resistance value which is the DC resistance value between the positive power supply terminal 22a and the positive load terminal 23a through a plurality of the positive smoothing terminals 24a and the positive wiring 30a, and a negative wiring board side DC resistance value which is the DC resistance value between the negative power supply terminal 22b and the negative load terminal 23b through a plurality of the negative smoothing terminals 24b and the negative wiring 30b. In the capacitor board unit 1 of the present embodiment, the sum of the DC resistance component 20R present on a path from the positive power supply terminal 22a to the positive load terminal 23a of the positive bus bar 20a, and the DC resistance component 20R present on a path from the negative power supply terminal 22b to the negative load terminal 23b of the negative bus bar 20b is set to be as small as possible compared to the sum of the DC resistance components 30R of the positive wiring 30a and the negative wiring 30b. With this setting, the bus bar side DC resistance value becomes smaller than the wiring board side DC resistance value.

Hereinafter, the sum of the DC resistance component 20R present on a path from the positive power supply terminal 22a to the positive load terminal 23a of the positive bus bar 20a, and the DC resistance component 20R present on a path from the negative power supply terminal 22b to the negative load terminal 23b of the negative bus bar 20b is denoted by Σ20R. In addition, the sum of the DC resistance components 30R of the positive wiring 30a and the negative wiring 30b is denoted by Σ30R. That is, in the capacitor board unit 1, Σ20R<<Σ30R is satisfied. In other words, the sum of the DC resistance value from the positive power supply terminal 22a to the positive load terminal 23a of the positive bus bar 20a, and the DC resistance value from the negative power supply terminal 22b to the negative load terminal 23b of the negative bus bar 20b is set to be as small as possible compared to the sum of the DC resistance value of the positive wiring 30a and the DC resistance value of the negative wiring 30b. Σ20R between the power supply terminal 22 and the load terminal 23, out of the plurality of load terminals 23, that is farthest from the power supply terminal 22 is the greatest, and in this greatest Σ20R, Σ20R<<Σ30R is satisfied.

If the DC resistance components are set as described above, as indicated by the thick arrow in FIG. 8, DC current supplied from the external power supply 100 flows through a path passing from the positive bus bar 20a through the power conversion unit 200 to the negative bus bar 20b. DC current hardly flows through paths (broken line arrows shown in FIG. 8) passing through a plurality of the positive smoothing terminals 24a and the positive wiring 30a to the positive load terminal 23a. Similarly, DC current hardly flows through paths (broken line arrows shown in FIG. 8) passing through a plurality of the negative smoothing terminals 24b and the negative wiring 30b to the negative power supply terminal 22b. In this case, heat generation due to large DC current occurs in the positive bus bar 20a, the negative bus bar 20b, or components connected to the bus bar 20, but DC current hardly flows through the positive wiring 30a, the capacitor 10, and the negative wiring 30b and therefore heat generation hardly occurs in these places. Even when heat generation occurs in the bus bar 20 and components connected to the bus bar 20, the influence of the heat on the capacitor 10 due to heat generation in the bus bar 20 and the like is small because the capacitor 10 is connected to the bus bar 20 via the wiring of the wiring board 30. Therefore, temperature increase in the capacitor 10 can be prevented. Since temperature increase in the capacitor 10 can be prevented, deterioration, failure, and the like of the capacitor 10 can be suppressed.

In the aluminum electrolytic capacitor used in the present embodiment, reduction in the capacitance due to aging and increase in the equivalent series resistance value ESR are accelerated due to temperature increase. Even in the case where the aluminum electrolytic capacitor is used as the capacitor 10, temperature increase in the capacitor 10 can be prevented, and therefore deterioration in the aluminum electrolytic capacitor can be suppressed.

Specifically, it is preferable that Σ20R is not greater than 1/30 of Σ30R. When Σ20R is not greater than 1/30 of Σ30R, about 97% of the DC current flows through the bus bar 20. Since only about 3% of the DC current flows through the positive wiring 30a, the capacitor 10, and the negative wiring 30b, heat generation in the positive wiring 30a, the capacitor 10, and the negative wiring 30b can be suppressed. In addition, since temperature increase in the capacitor 10 can be prevented, deterioration, failure, and the like of the capacitor 10 can be suppressed.

Hereinafter, a specific example will be described. When the wire length and the length of the bus bar are equal with each other, if the wiring layer of a copper foil is formed so as to have a thickness of 0.105 mm and a wire width of 4 mm, and the bus bar 20 made of a copper material is formed so as to have a cross-sectional area of 13 $mm^2$, the bus bar side DC resistance value can be set to be not greater than $\frac{1}{30}$ of the wiring board side DC resistance value. The dimensional configuration example of the wire and the bus bar 20 is not limited thereto.

<Path of AC Current in Equivalent Circuit of the Capacitor Board Unit 1>

A path of AC current in the equivalent circuit in the capacitor board unit 1 shown in FIG. 7 will be described with reference to FIG. 9. The external power supply 100 which is a DC power supply is connected between the positive power supply terminal 22a and the negative power supply terminal 22b in FIG. 7, and the power conversion unit 200 is connected between a pair of the positive load terminal 23a and the negative load terminal 23b. In FIG. 9, the thick arrow indicates the path through which the AC current mainly flows.

In the capacitor board unit 1, due to pulsation of voltage inputted to the capacitor board unit 1, periodic pulsating current occurs in the current at the time of charging and discharging of the capacitor 10. Considering the periodic pulsating current to be AC current, voltage outputted to the power conversion unit 200 may vary. The capacitor board unit 1 of the present embodiment suppresses variation in output voltage due to pulsation in input voltage.

With respect to each of the plurality of positive load terminals 23a and the plurality of negative load terminals 23b, a capacitor side inductance value which is the inductance value between the positive load terminal 23a and the negative load terminal 23b through a plurality of the positive smoothing terminals 24a, the positive wiring 30a, a plurality of the capacitors 10, the negative wiring 30b, and a plurality of the negative smoothing terminals 24b is smaller than a bus bar side inductance value which is the sum of the inductance value of the positive bus bar 20a from the positive power supply terminal 22a to the positive load terminal 23a and the inductance value of the negative bus bar 20b from the negative power supply terminal 22b to the negative load terminal 23b. In the capacitor board unit 1 of the present embodiment, the sum of the inductance component 20L present on a path from the positive power supply terminal 22a to the positive load terminal 23a of the positive bus bar 20a, and the inductance component 20L present on a path from the negative power supply terminal 22b to the negative load terminal 23b of the negative bus bar 20b is set to be as large as possible compared to the sum of the inductance components 30L of the positive wiring 30a and the negative wiring 30b and the inductance component 10L of the capacitor 10 connected between the positive smoothing terminal 24a and the negative smoothing terminal 24b.

Hereinafter, the sum of the inductance component 20L present on a path from the positive power supply terminal 22a to the positive load terminal 23a of the positive bus bar 20a, and the inductance component 20L present on a path from the negative power supply terminal 22b to the negative load terminal 23b of the negative bus bar 20b is denoted by 120L. In addition, the sum of the inductance components 30L of the positive wiring 30a and the negative wiring 30b and the inductance component 10L of the capacitor 10 connected between the positive smoothing terminal 24a and the negative smoothing terminal 24b is denoted by Σ(30L+ 10L). That is, in the capacitor board unit 1, Σ20L>>Σ(30L+ 10L) is satisfied. In other words, the sum of the inductance value from the positive power supply terminal 22a to the positive load terminal 23a of the positive bus bar 20a, and the inductance value from the negative power supply terminal 22b to the negative load terminal 23b of the negative bus bar 20b is set to be as large as possible compared to the sum of the inductance value of the positive wiring 30a, the inductance value of the negative wiring 30b, and the inductance value of the capacitor 10 from the positive smoothing terminal 24a to the negative smoothing terminal 24b.

If the inductance components are set as described above, as indicated by the thick arrow in FIG. 9, AC current due to pulsation of output voltage from the power conversion unit 200 flows through a path passing from the positive smoothing terminal 24a through the positive wiring 30a, the capacitor 10, and the negative wiring 30b to the negative smoothing terminal 24b. AC current hardly flows through a path (broken line arrow shown in FIG. 9) passing from the positive bus bar 20a through the external power supply 100 to the negative bus bar 20b. Accordingly, AC current due to pulsation of input voltage hardly flows to the external power supply 100, and thus variation in power supply voltage due to pulsation of output voltage can be suppressed. Therefore, the capacitor board unit 1 in which the AC current component flowing to the outside is suppressed can be obtained.

Specifically, it is preferable that Σ20L is not less than 20 times Σ(30L+10L). When Σ20L is not less than 20 times Σ(30L+10L), about 95% of the AC current flows through the positive wiring 30a, the capacitor 10, and the negative wiring 30b. Since only about 5% of the AC current flows in the path through the bus bar 20 to the external power supply 100, variation in power supply voltage due to pulsation of output voltage can be suppressed.

When the sum of the inductance value of each of the positive wiring 30a and the negative wiring 30b in the capacitor side inductance value is not greater than $\frac{1}{3}$ of the bus bar side inductance value, AC current due to pulsation of output voltage from the power conversion unit 200 further flows through a path passing from the positive smoothing terminal 24a through the positive wiring 30a, the capacitor 10, and the negative wiring 30b to the negative smoothing terminal 24b. Thus, the AC current component flowing from the capacitor board unit 1 to the outside can be significantly suppressed. When the dimensional configuration of the wire and the bus bar 20 is set to the configuration described above, the sum of the inductance value of each of the positive wiring 30a and the negative wiring 30b in the capacitor side inductance value can be set to be not greater than $\frac{1}{3}$ of the bus bar side inductance value.

In the present embodiment, the positive bus bar 20a has n (n is an integer of 2 or greater) positive load terminals 23a respectively connected to positive electrodes of n power conversion units 200, and n positive smoothing terminals 24a provided so as to be respectively adjacent to the n positive load terminals 23a. The negative bus bar 20b has n negative load terminals 23b respectively connected to negative electrodes of the n power conversion units 200, and n negative smoothing terminals 24b provided so as to be respectively adjacent to the n negative load terminals 23b. As shown in FIG. 7, when the positive smoothing terminals 24a and the negative smoothing terminals 24b are disposed in this manner, AC current due to pulsation of output voltage from each power conversion unit 200 easily flows through a path passing from the positive smoothing terminal 24a through the positive wiring 30a, the capacitor 10, and the negative wiring 30b to the negative smoothing terminal 24b. Since AC current easily flows through a path passing from the positive smoothing terminal 24a through the positive wiring 30a, the capacitor 10, and the negative wiring 30b to the negative smoothing terminal 24b, variation in power supply voltage due to pulsation of output voltage can be significantly suppressed.

When the capacitor board unit 1 in which $\Sigma 20R \ll \Sigma 30R$ and $\Sigma 20L \gg \Sigma(30L+10L)$ are satisfied is used in the power conversion device 500, even if large current flows, a large portion of the DC current component flows through the bus bar 20 and does not flow through the wiring board 30 and the capacitor 10. Therefore, in the power conversion device 500, temperature increase in the capacitor 10 is suppressed and deterioration, failure, and the like of the capacitor 10 can be suppressed. In addition, a large portion of the AC current component due to pulsation of voltage of the power conversion unit 200 flows through the wiring board 30 and the capacitor 10 and does not flow through the external power supply 100. Thus, variation in power supply voltage due to pulsation can be suppressed. Therefore, the power conversion device 500 in which the AC current component flowing to the outside is suppressed can be obtained. Since the AC current component flowing to the outside is suppressed, the device connected to the external power supply 100 can stably perform operation.

The load connected to the capacitor board unit 1 is not limited to the power conversion unit 200. The capacitor board unit 1 may be used in a device different from the power conversion device 500.

Thus, in the capacitor board unit 1 according to embodiment 1, a bus bar side DC resistance value which is the sum of the DC resistance value of the positive bus bar 20a from the positive power supply terminal 22a to each positive load terminal 23a and the DC resistance value of the negative bus bar 20b from the negative power supply terminal 22b to each negative load terminal 23b is smaller than a wiring board side DC resistance value which is the sum of a positive wiring board side DC resistance value which is the DC resistance value between the positive power supply terminal 22a and the positive load terminal 23a through a plurality of the positive smoothing terminals 24a and the positive wiring 30a, and a negative wiring board side DC resistance value which is the DC resistance value between the negative power supply terminal 22b and the negative load terminal 23b through a plurality of the negative smoothing terminals 24b and the negative wiring 30b. In addition, a capacitor side inductance value which is the inductance value between the positive load terminal 23a and the negative load terminal 23b through a plurality of the positive smoothing terminals 24a, the positive wiring 30a, a plurality of the capacitors 10, the negative wiring 30b, and a plurality of the negative smoothing terminals 24b is smaller than a bus bar side inductance value which is the sum of the inductance value of the positive bus bar 20a from the positive power supply terminal 22a to the positive load terminal 23a and the inductance value of the negative bus bar 20b from the negative power supply terminal 22b to the negative load terminal 23b. Accordingly, DC current hardly flows through the positive wiring 30a, the capacitor 10, and the negative wiring 30b, and thus, temperature increase in the capacitor 10 can be suppressed. Since AC current due to pulsation of output voltage from the power conversion unit 200 flows through a path passing from the positive smoothing terminal 24a through the positive wiring 30a, the capacitor 10, and the negative wiring 30b to the negative smoothing terminal 24b, the AC current component flowing from the capacitor board unit 1 to the outside can be suppressed.

The positive bus bar 20a may have n (n is an integer of 2 or greater) positive load terminals 23a respectively connected to positive electrodes of n power conversion units 200, and n positive smoothing terminals 24a provided so as to be respectively adjacent to the n positive load terminals 23a, and the negative bus bar 20b may have n negative load terminals 23b respectively connected to negative electrodes of the n power conversion units 200, and n negative smoothing terminals 24b provided so as to be respectively adjacent to the n negative load terminals 23b. Then, AC current due to pulsation of output voltage from the power conversion unit 200 can be easily caused to flow through a path passing from the positive smoothing terminal 24a through the positive wiring 30a, the capacitor 10, and the negative wiring 30b to the negative smoothing terminal 24b.

The wiring board 30 may include: the first positive side wire 31a to which the n positive smoothing terminals 24a are dispersedly connected; the second positive side wire 31b to which the positive capacitor terminals 10a of the plurality of capacitors 10 are dispersedly connected; n positive side connection wires 31c respectively connecting n portions connected to the n positive smoothing terminals 24a in the first positive side wire 31a and *n* dispersed portions in the second positive side wire 31b; the first negative side wire 32a to which n negative smoothing terminals 24b are dispersedly connected; the second negative side wire 32b to which the negative capacitor terminals 10b of the plurality of capacitors 10 are dispersedly connected; and n negative side connection wires 32c respectively connecting n portions connected to the n negative smoothing terminals 24b in the first negative side wire 32a and *n* dispersed portions in the second negative side wire 32b. Then, low inductance of the wiring board 30 can be realized.

The first positive side wire 31a and the second positive side wire 31b may be linearly formed and may be disposed in parallel with each other, and the first negative side wire 32a and the second negative side wire 32b may be linearly formed and may be disposed in parallel with each other. Then, low inductance of the wiring board 30 can be further realized.

The plurality of capacitors 10 may be connected in parallel between the plurality of positive smoothing terminals 24a and the plurality of negative smoothing terminals 24b. Then, the capacitor board unit 1 having a small size and a large capacitance can be realized. Further, in the wiring board 30, the wiring layer 50 having the wiring may be provided in a layered manner. Then, positive and negative patterns of the wiring layers are provided to be close to each other, and thus, low inductance of the wiring board 30 can be easily realized. When low inductance of the wiring board 30 is realized, AC current due to pulsation of output voltage from the power conversion unit 200 can be easily caused to flow through a path passing from the positive smoothing terminal 24a through the positive wiring 30a, the capacitor 10, and the negative wiring 30b to the negative smoothing terminal 24b.

The bus bar side DC resistance value may be not greater than $\frac{1}{30}$ of the wiring board side DC resistance value. Then, DC current hardly flows through the positive wiring 30a, the capacitor 10, and the negative wiring 30b, and thus, heat generation in the positive wiring 30a, the capacitor 10, and the negative wiring 30b can be significantly suppressed. The sum of the inductance value of each of the positive wiring 30a and the negative wiring 30b in the capacitor side inductance value is not greater than $\frac{1}{3}$ of the bus bar side inductance value. Then, AC current due to pulsation of output voltage from the power conversion unit 200 further flows through a path passing from the positive smoothing terminal 24a through the positive wiring 30a, the capacitor 10, and the negative wiring 30b to the negative smoothing terminal 24b. Therefore, the AC current component flowing from the capacitor board unit 1 to the outside can be significantly suppressed.

Each capacitor 10 may be an aluminum electrolytic capacitor. Then, since the aluminum electrolytic capacitor is a capacitor that has the largest capacitance per unit volume, if a plurality of aluminum electrolytic capacitors are connected in parallel to be used, the capacitor board unit 1 having a small size and a large capacitance can be realized. The positive bus bar 20*a* and the negative bus bar 20*b* may be electrically and mechanically connected to the wiring board 30. Then, the bus bar 20 and the wiring board 30 can be electrically and mechanically connected due to reflow. Thus, work steps and cost are reduced, and the structure is also simplified. Therefore, productivity of the capacitor board unit 1 can be improved. The wiring board 30 may be a glass composite board or a glass epoxy board having a multilayer structure. Then, production steps can be reduced due to reflow, and since the capacitor board unit 1 adapted to large current can be manufactured by an easily-available general material, productivity of the capacitor board unit 1 can be improved.

The power conversion device 500 according to embodiment 1 includes: the capacitor board unit 1 according to the present disclosure; and the power conversion unit 200 connected between each of the plurality of positive load terminals 23*a* and each of the plurality of negative load terminals 23*b*. Thus, AC current due to pulsation of output voltage from the power conversion unit 200 flows through a path passing from the positive smoothing terminal 24*a* through the positive wiring 30*a*, the capacitor 10, and the negative wiring 30*b* to the negative smoothing terminal 24*b*. Thus, the AC current component flowing from the power conversion device 500 to the outside can be suppressed.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS 1 capacitor board unit
10 capacitor
10*a* positive capacitor terminal
10*b* negative capacitor terminal
10L, 20L, 30L inductance component
10R, 20R, 30R DC resistance component
20 bus bar
20*a* positive bus bar
20*b* negative bus bar
21 resin portion
22 power supply terminal
22*a* positive power supply terminal
22*b* negative power supply terminal
23 load terminal
23*a* positive load terminal 23*b* negative load terminal
24*a* positive smoothing terminal
24*b* negative smoothing terminal
30 wiring board
30*a* positive wiring
30*b* negative wiring
31*a* first positive side wire
31*b* second positive side wire
31*c* positive side connection wire
32*a* first negative side wire
32*b* second negative side wire
32*c* negative side connection wire
40 screw fastening hole
50 wiring layer
60 solder
70 solder resist
80 pre-preg
90 core material
100 external power supply
200 power conversion unit
300 external device
500 power conversion device

The invention claimed is:

1. A capacitor board unit comprising:
a wiring board having wiring;
a positive bus bar having at least one positive power supply terminal connected to a positive electrode of a power supply, a plurality of positive load terminals respectively connected to positive electrodes of a plurality of loads, and a plurality of positive smoothing terminals connected to the wiring;
a negative bus bar having at least one negative power supply terminal connected to a negative electrode of the power supply, a plurality of negative load terminals respectively connected to negative electrodes of the plurality of loads, and a plurality of negative smoothing terminals connected to the wiring; and
a plurality of capacitors each having a positive capacitor terminal and a negative capacitor terminal, the positive capacitor terminal and the negative capacitor terminal being connected to the wiring, wherein
the wiring has positive wiring which connects, in series and in parallel, the plurality of positive smoothing terminals and the plurality of positive capacitor terminals, and negative wiring which connects, in series and in parallel, the plurality of negative smoothing terminals and the plurality of negative capacitor terminals,
a bus bar side DC resistance value which is a sum of a DC resistance value of the positive bus bar from the positive power supply terminal to each positive load terminal and a DC resistance value of the negative bus bar from the negative power supply terminal to each negative load terminal is smaller than a wiring board side DC resistance value which is a sum of a positive wiring board side DC resistance value which is a DC resistance value between the positive power supply terminal and the positive load terminal through a plurality of the positive smoothing terminals and the positive wiring, and a negative wiring board side DC resistance value which is a DC resistance value between the negative power supply terminal and the negative load terminal through a plurality of the negative smoothing terminals and the negative wiring, and
a capacitor side inductance value which is an inductance value between the positive load terminal and the negative load terminal through a plurality of the positive smoothing terminals, the positive wiring, a plurality of the capacitors, the negative wiring, and a plurality of the negative smoothing terminals is smaller than a bus bar side inductance value which is a sum of an inductance value of the positive bus bar from the positive power supply terminal to the positive load terminal and an inductance value of the negative bus bar from the negative power supply terminal to the negative load terminal.

2. The capacitor board unit according to claim 1, wherein the positive bus bar has n said positive load terminals respectively connected to positive electrodes of n said loads, n being an integer of 2 or greater, and n said positive smoothing terminals provided so as to be respectively adjacent to the n positive load terminals, and the negative bus bar has n said negative load terminals respectively connected to negative electrodes of the n loads, and n said negative smoothing terminals provided so as to be respectively adjacent to the n negative load terminals.

3. The capacitor board unit according to claim 2, wherein the wiring board includes:

a first positive side wire to which the n positive smoothing terminals are dispersedly connected;

a second positive side wire to which the positive capacitor terminals of the plurality of capacitors are dispersedly connected;

n positive side connection wires respectively connecting n portions connected to the n positive smoothing terminals in the first positive side wire and n dispersed portions in the second positive side wire;

a first negative side wire to which the n negative smoothing terminals are dispersedly connected;

a second negative side wire to which the negative capacitor terminals of the plurality of capacitors are dispersedly connected; and n negative side connection wires respectively connecting n portions connected to the n negative smoothing terminals in the first negative side wire and n dispersed portions in the second negative side wire.

4. The capacitor board unit according to claim 3, wherein the first positive side wire and the second positive side wire are linearly formed and are disposed in parallel with each other, and the first negative side wire and the second negative side wire are linearly formed and are disposed in parallel with each other.

5. The capacitor board unit according to claim 1, wherein the plurality of capacitors are connected in parallel between the plurality of positive smoothing terminals and the plurality of negative smoothing terminals.

6. The capacitor board unit according to claim 1, wherein in the wiring board, a wiring layer having the wiring is provided in a layered manner.

7. The capacitor board unit according to claim 1, wherein the bus bar side DC resistance value is not greater than $\frac{1}{30}$ of the wiring board side DC resistance value.

8. The capacitor board unit according to claim 1, wherein a sum of an inductance value of each of the positive wiring and the negative wiring in the capacitor side inductance value is not greater than $\frac{1}{3}$ of the bus bar side inductance value.

9. The capacitor board unit according to claim 1, wherein each capacitor is an aluminum electrolytic capacitor.

10. The capacitor board unit according to claim 1, wherein the positive bus bar and the negative bus bar are electrically and mechanically connected to the wiring board.

11. The capacitor board unit according to claim 1, wherein the wiring board is a glass composite board or a glass epoxy board having a multilayer structure.

12. A power conversion device comprising:

the capacitor board unit according to claim 1; and a power conversion unit connected between each of the plurality of positive load terminals and each of the plurality of negative load terminals.

\* \* \* \* \*